United States Patent
Al-Fandi et al.

(10) Patent No.: US 10,037,865 B2
(45) Date of Patent: Jul. 31, 2018

(54) SYSTEM AND METHOD FOR PROVIDING REAL-TIME VISUAL FEEDBACK TO CONTROL MULTIPLE AUTONOMOUS NANO-ROBOTS

(71) Applicants: Jordan University of Science and Technology, Irbid (JO); Mohamed Ghazi Daifalla Al-Fandi, Irbid (JO); Mohammad Abdel Majeed Fandi Al Rousan, Irbid (JO); Mohammad Abdel Kareem Rasheed Jaradat, Irbid (JO); Fahed Hasan Fahed Awad, Irbid (JO); Inad AbedAlmohdi Rida Aljarrah, Irbid (JO); Omar Mahmoud Mohammad Al-Jarrah, Irbid (JO)

(72) Inventors: Mohamed Ghazi Daifalla Al-Fandi, Irbid (JO); Mohammad Abdel Majeed Fandi Al Rousan, Irbid (JO); Mohammad Abdel Kareem Rasheed Jaradat, Irbid (JO); Fahed Hasan Fahed Awad, Irbid (JO); Inad AbedAlmohdi Rida Aljarrah, Irbid (JO); Omar Mahmoud Mohammad Al-Jarrah, Irbid (JO)

(73) Assignee: JORDAN UNIVERSITY OF SCIENCE AND TECHNOLOGY, Irbid (JO)

( * ) Notice: Subject to any disclaimer, the term of this patent is extended or adjusted under 35 U.S.C. 154(b) by 70 days.

(21) Appl. No.: 14/853,236

(22) Filed: Sep. 14, 2015

(65) Prior Publication Data

US 2017/0076909 A1 Mar. 16, 2017

(51) Int. Cl.
*H01J 37/20* (2006.01)
*H01J 37/28* (2006.01)

(52) U.S. Cl.
CPC ........... *H01J 37/20* (2013.01); *H01J 37/28* (2013.01); *H01J 2237/28* (2013.01)

(58) Field of Classification Search
CPC .. B25J 9/104; B25J 9/0015; B25J 7/00; Y10T 74/20323; Y10T 74/20305; Y10T 74/20348; H01J 37/20; H01J 37/28
See application file for complete search history.

(56) References Cited

U.S. PATENT DOCUMENTS 6,862,924 B2    3/2005   Xi et al.
6,891,170 B1 *  5/2005   Yu .......................... G02B 21/32
                                                     250/442.11

(Continued)

OTHER PUBLICATIONS

International Searching Authority, International Search Report and the Written Opinion, PCT/US2016/051665, dated Jul. 3, 2017.

(Continued)

*Primary Examiner* — Wyatt Stoffa
(74) *Attorney, Agent, or Firm* — Matheson Keys Daffer & Kordzik PLLC; Kelly Kordzik

(57) ABSTRACT

The present invention relates to a system and method for providing real-time visual feedback to automatically control actions of multiple autonomous nano-robots with manipulators in order to perform specific nano-manipulation or nano-assembly tasks. In the system and method of the present invention, the visual feedback is obtained for the nano-manipulators and the nano-components via an electronic microscopy system. The system of the present invention comprises essentially at least one slave Scanning Electron Microscope (SEM) with imaging system deployed with autonomous manipulators inside, and a master controller system with Graphical User Interface (GUI). In the system of the present invention, said slave SEM provides real-time vision feedback for the sensed environment for said master controller, and said master controller provides real-time feedback control command for the required task to said slave SEM.

13 Claims, 18 Drawing Sheets

(56) References Cited

U.S. PATENT DOCUMENTS

| | | |
|---|---|---|
| 6,967,335 B1 | 11/2005 | Dyer et al. |
| 7,041,985 B1 * | 5/2006 | Wang ........................ G01N 1/32 |
| | | 250/442.11 |
| 7,297,946 B2 | 11/2007 | Xi et al. |
| 9,891,280 B2 * | 2/2018 | Ukraintsev ...... G01R 31/31728 |
| 2004/0183012 A1 | 9/2004 | Yaguchi et al. |
| 2005/0145791 A1 | 7/2005 | Fujita et al. |
| 2010/0126297 A1 * | 5/2010 | Popa .......................... B25J 7/00 |
| | | 74/490.04 |
| 2013/0032714 A1 | 2/2013 | Kitayama et al. |

OTHER PUBLICATIONS

Robosem, European Commission, "Smart and small robots for the micro-world," 2 pages, Released May 2002.

Fatikow, S., et al., "Microrobot System for Automatic Nanohandling inside a Scanning Electron Microscope," IEEE International Conference on Robotics and Automation, Orlando, Florida, pp. 1402-1407, May 2006.

Fatikow, S., et al., "Microrobot System for Automatic Nanohandling Inside a Scanning Electron Microscope," IEEE/ASME Transactions on Mechatronics, vol. 12, No. 3, pp. 244-252, Jun. 2007.

\* cited by examiner

SYSTEM AND METHOD FOR PROVIDING REAL-TIME VISUAL FEEDBACK TO CONTROL MULTIPLE AUTONOMOUS NANO-ROBOTS

BACKGROUND

Field of the Invention

The present invention relates to systems and methods used for providing real-time visual feedback to automatically control actions of multiple autonomous robots, and more particularly to those systems and methods that control actions of nano-robots with nano-manipulators.

Description of the Related Art

Numerous conventional solutions found in the art provide systems and methods of controlling actions of robots to enable manipulation tasks. Among such conventional solutions lie the U.S. Pat. No. 6,967,335, the U.S. Pat. No. 7,297,946, U.S. Pat. No. 6,891,170, U.S. Pat. No. 6,862,924, the European project titled "Smart and small robots for the micro-world", the scientific article titled "Microrobot system for automatic nanohandling inside a scanning electron microscope" by Fatikow, S., et al published on May, 2006, and the scientific article titled "Microrobot system for automatic nanohandling inside a scanning electron microscope" by Fatikow, S., et al published on June, 2007.

U.S. Pat. No. 6,967,335 discloses a system and method to enable manipulation of a sample under study with a microscope. In one embodiment, a manipulation system is adaptable for interfacing with any of a plurality of different types of microscopes, such as a Transmission Electron Microscope (TEM) and a Scanning Electron Microscope (SEM), and further comprises at least one manipulation mechanism operable to manipulate a sample. In another embodiment, a manipulation system is capable of being detachably coupled to a microscope, such as a TEM, and comprises a plurality of manipulator mechanisms for manipulating a sample. In a preferred embodiment, the manipulation system comprises both an adjustable interface such that it is capable of selectively coupling with any of a plurality of different microscope interfaces and a plurality of manipulator mechanisms integrated therein that are controllably operable for manipulating a sample.

U.S. Pat. No. 7,297,946 provides an automated nano-manipulation system for manufacturing a nano-scale structure. The system includes: a design model for the nano-scale structure; image data of a sample surface upon which the nano-scale structure is to be manufactured; a movable member configured to perform a nano-manipulation operation on the sample surface; and a path planning subsystem adapted to receive the design model and the image data. The path planning subsystem generates path data indicative of a path for traversing the movable member along the sample surface such that the movable member manipulates one or more randomly distributed nano-objects in accordance with the design model.

In U.S. Pat. No. 6,891,170, a modular manipulation system and method for using such modular manipulation system for manipulating a sample under study with a microscope are provided. According to at least one embodiment, a platform is provided that comprises an interface to a microscope, a sample stage, and a plurality of interfaces for receiving manipulator modules for manipulating a sample arranged on the sample stage. Preferably, the plurality of interfaces for receiving manipulator modules are each capable of detachably coupling a manipulator module to the platform. Thus, in a preferred embodiment, a user may selectively couple one or more desired manipulator modules to the platform to enable a desired type of manipulation to be performed on a sample under study. Accordingly, a preferred embodiment enables great flexibility in configuring a manipulation system in a desired manner.

U.S. Pat. No. 6,862,924 provides a method for performing nano-manipulations using an atomic force microscope. The method includes: performing a nano-manipulation operation on a sample surface using an atomic force microscope; determining force data for forces that are being applied to the tip of the cantilever during the nano-manipulation operation, where the force data is derived along at least two perpendicularly arranged axes; and updating a model which represents the topography of the sample surface using the force data.

In the European project titled "Smart and small robots for the micro-world", there is provided a nano-handling station operating in an SEM. Two robot platforms for coarse positioning (semiautonomous and a fixed) were developed in this project, wherein the design of the robots allow an easy conversion of the desktop station for different applications. Beside the SEM, micro video cameras and tactile-/force microsensors have been developed and integrated. Under such project, real-time image recognition and real-time processing of acquired force information were adopted.

Fatikow, S., et al., (2006) developed an automated nano-handling cell in a scanning electron microscope (SEM) is presented. An experimental setup is shown, in which two micro robots cooperate in the vacuum chamber of an SEM. A client-server control system that can integrate various micro robots and sensors has been developed and evaluated by automatic handling of TEM (transmission electron microscope) lamellae. The robots are controlled in a closed-loop way by using images from several CCD cameras and from the SEM. Algorithms for real-time processing of noisy SEM images have been implemented and tested. The hardware setup of the nano-handling cell consists of an SEM, two multi-DOF micro robots and the sensors for pose and contact detection.

Fatikow, S., et al., (2007) developed an automated nano-handling station in an SEM. In a described experimental setup, two mobile micro robots cooperate in the vacuum chamber of the SEM. The robots are positioned by a closed-loop controller with sensor data, which is provided by three charge-coupled device cameras and the SEM. Continuous pose estimation is carried out by processing noisy SEM images in real time. To enable the automation of complex tasks, a client-server control system that can integrate various micro robots and sensors is introduced. The overall system was evaluated by automatic handling of transmission electron microscope lamellae.

SUMMARY

None of the prior art documents provides a system and method for providing real-time visual feedback to control multiple autonomous nano-robots using a Scanning Electron Microscope (SEM).

Therefore, it is an object of the present invention to provide a system and method for providing real-time visual feedback to control the actions of multiple nano-robots using SEM for enabling the manipulation/assembly of hybrid nano-components and particles.

As another object of the present invention, there is provided a system and method that reduce the time and cost for a high precision nano-manufacturing of hybrid nano-systems.

In one aspect of the present invention, there is provided a system for providing real-time visual feedback to control the actions of multiple nano-robots, wherein such system comprises essentially at least one slave SEM with imaging system deployed with autonomous manipulators inside, and a master controller with Graphical User Interface (GUI).

In another aspect of the present invention, the at least one slave SEM provides real-time vision feedback for the sensed environment for said master controller.

In yet another aspect of the present invention, the at least master controller provides real-time feedback control command for the required task to said slave SEM.

In yet another aspect of the present invention, the at least master controller receives user input command through the GUI.

Preferably, said at least one master controller comprises a real-time image acquisition unit, an image processing unit, an autonomous manipulators/objects detection and segmentation unit, and a controller unit.

Preferably, said at least one slave SEM with imaging system comprises autonomous robot manipulators drivers, and an SEM with imaging system deployed with autonomous manipulator inside.

Preferably, said autonomous manipulators/objects detection and segmentation unit comprises a detection sub-unit, a tracking sub-unit, a decision sub-unit, and a movement manager sub-unit.

As another aspect of the present invention, there is provided a method for providing real-time visual feedback to control the actions of multiple nano-robots, wherein such method comprises the steps of:
  Capturing an image of a sample by an SEM;
  Subtracting background from the captured image;
  Detecting a tip of at least one probe;
  Feeding the detected tip position to a controller subsystem; and
  Instructing, by the controller subsystem, autonomous robot manipulator drivers to move the nano-manipulators accordingly.

Preferably, the comparison between the detected tip and the expected tip is performed by three alternate techniques.

Preferably, said three alternate techniques comprise line intersection, circle intersection, and width-signature.

Preferably, if none of said alternate techniques succeeds, then the steps of said method are repeated.

BRIEF DESCRIPTION OF THE DRAWINGS

The invention will now be described with reference to the accompanying drawings, which illustrate a system and method for providing real-time visual feedback to control multiple autonomous nano-robots using an SEM, configured according to a preferred embodiment of the present invention, without limiting the scope of the invention thereof, and in which.

DETAILED DESCRIPTION OF THE INVENTION

Figure 1:
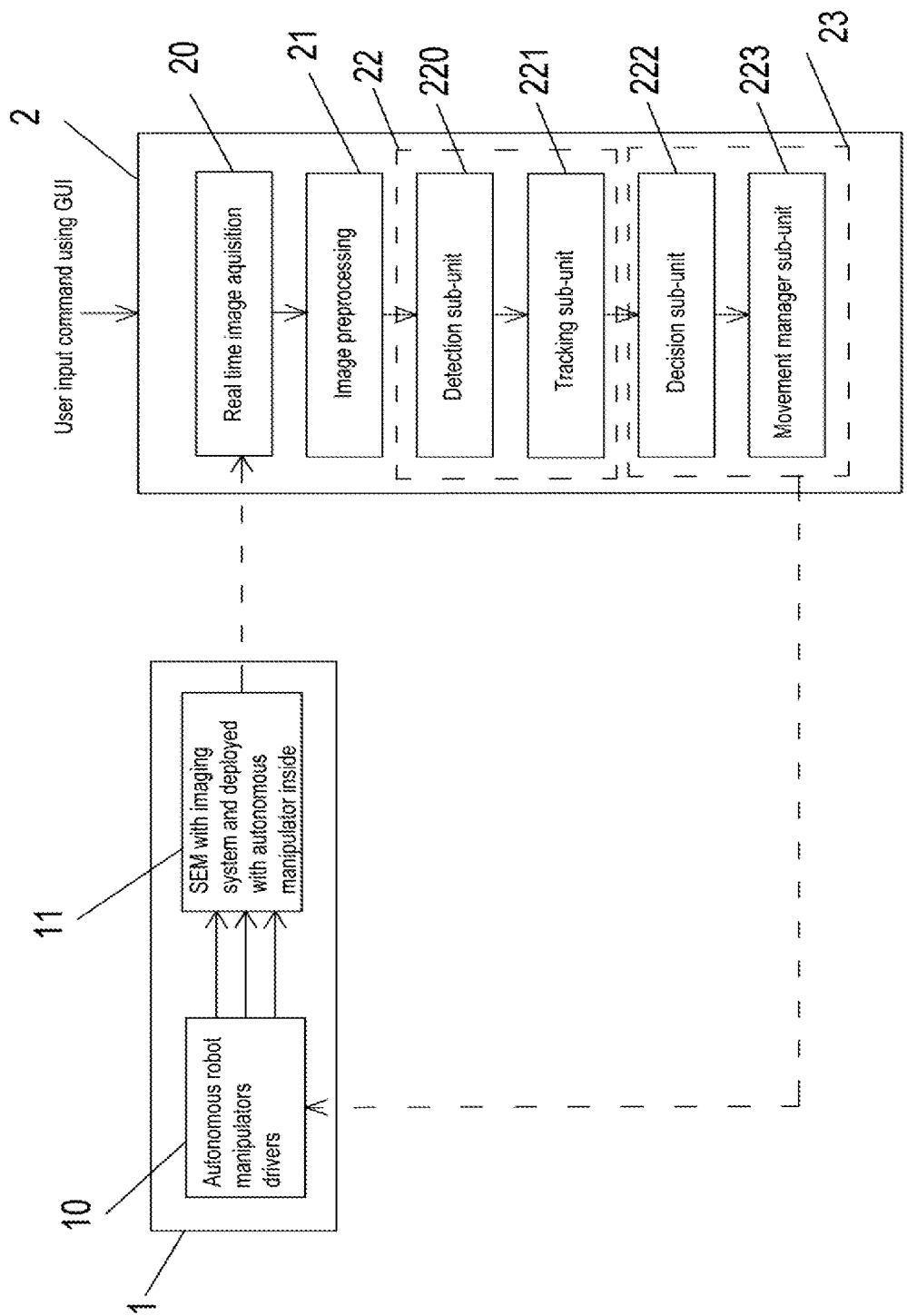
FIG. 1 is a block diagram of a system for providing real-time visual feedback to control multiple autonomous nano-robots using an SEM configured in accordance with a preferred embodiment of the present invention.

FIGS. 1-17 illustrate a system and method for providing real-time visual feedback to control the actions of multiple nano-robots using Scanning Electron Microscopy (SEM) for enabling the manipulation/assembly of hybrid nano-components and particles configured in accordance with a preferred embodiment of the present invention, wherein such embodiment comprises at least one slave SEM with imaging system deployed with autonomous manipulators inside 1, and at least one master controller with a Graphical User Interface (GUI) 2. In the preferred embodiment of the present invention, said at least one slave SEM 1 provides real-time visual feedback for the sensed environment for the said at least one master controller 2, and said at least one master controller 2 provides real-time feedback control command for the required task to the said at least one slave SEM 1.

In the preferred embodiment of the present invention, said at least one master controller 2 comprises a GUI unit (not shown), a real-time image acquisition unit 20, an image processing unit 21, an autonomous manipulators/objects detection and segmentation unit 22, and a controller unit 23.

In the preferred embodiment of the present invention, said at least one slave SEM 1 comprises autonomous robot manipulators' drivers 10 and an SEM with imaging system deployed with autonomous manipulators inside 11.

In the preferred embodiment of the present invention, said autonomous manipulators/objects detection and segmentation unit 22 comprises a detection sub-unit 220, and a tracking sub-unit 221.

In the preferred embodiment of the present invention, said GUI unit takes user input commands and parameters, such as the type of the object to be manipulated.

Said real-time image acquisition unit 20 takes snapshots of the platform where the robotic manipulators and the object to be manipulated reside.

Said Image processing unit 21 autonomously detects the manipulators and the object being manipulated, and identifies the instantaneous position and orientation of such manipulators and object being manipulated.

Said controller unit 23 comprises a decision sub-unit 222, and a movement manager sub-unit 223, wherein such controller unit 23 takes the information provided by said image processing unit 21, and sends the proper commands to control the movements of the robot manipulators via the drivers 10.

Said autonomous robot manipulators' drivers 10 controls the movements of the robot manipulators inside said SEM 1.

Said slave SEM with imaging system deployed with autonomous manipulators inside 11 holds the platform where the robot manipulators and the object to be manipulated reside.

Figure 2:
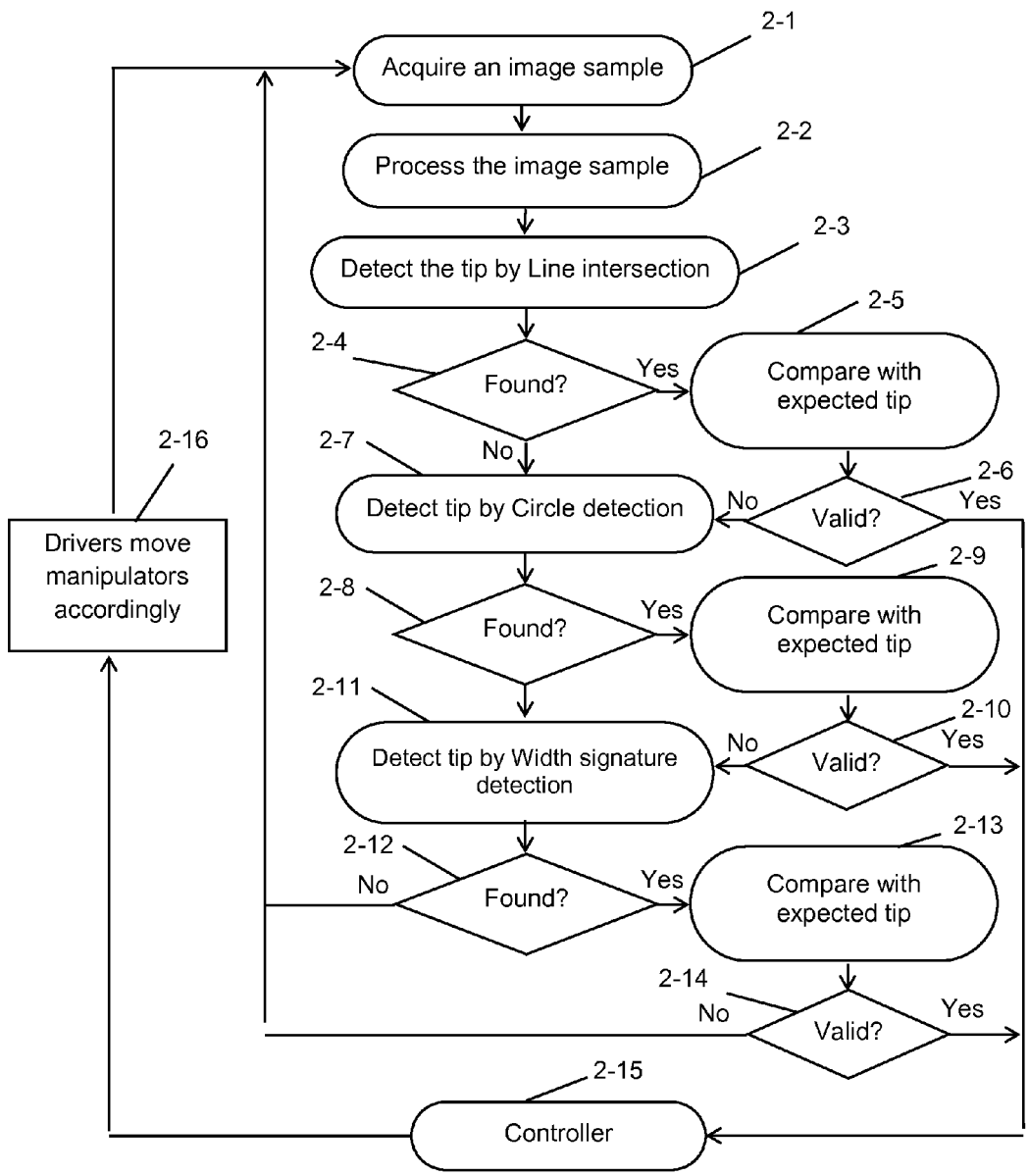
FIG. 2 is a flowchart of a method of providing real-time visual feedback to control multiple autonomous nano-robots using an SEM configured in accordance with a preferred embodiment of the present invention.

Reference is now made to FIG. 2, which illustrates a method of providing real-time visual feedback to control multiple autonomous nano-robots using an SEM configured in accordance with a preferred embodiment of the present invention, such method comprises the steps of:
  a. Acquiring, by the image acquisition unit, an image sample (block 2-1);
  b. Processing, by the image processing unit, the acquired image sample (block 2-2);
  c. Detecting, by the detection sub-unit, a tip of a manipulator probe by a line intersection technique (block 2-3);
  d. Determining if the tip of the manipulator is detected (block 2-4);
  e. Comparing the detected tip of step (c) with a predetermined expected tip (block 2-5) if the result at step (d) is affirmative;
  f. Determining if the result at step (e) is affirmative (block 2-6), if yes, the result will be sent to said controller unit (step (o));
  g. Detecting, by the detection sub-unit, the tip of the manipulator probe by a circle detection technique (block 2-7);
  h. Determining if the tip of the manipulator is detected (block 2-8);
  i. Comparing the detected tip of step (g) with a predetermined expected tip (block 2-9) if the result at step (h) is affirmative;
  j. Determining if the result at step (i) is affirmative (block 2-10), if yes, the result will be sent to said controller unit (step (o));
  k. Detecting, by the detection sub-unit, the tip of the manipulator probe by a width signature detection technique (block 2-11);
  l. Determining if the tip of the manipulator is detected (block 2-12);
  m. Comparing the detected tip of step (l) with a predetermined expected tip (block 2-13) if the result at step (l) is affirmative;
  n. Determining if the result at step (m) is affirmative (block 2-14), if yes, the result will be sent to said controller unit (step (o)), otherwise the process is repeated again; and
  o. sending, by the controller unit, (block 2-15) instructions to said autonomous robot manipulators' drivers to move the probe of the robot manipulator accordingly (block 2-16).

The SEM with imaging system 11 captures an image to the working space without the probe of the robotic manipulator, wherein the background subtraction takes place by subtracting the captured image of the working space without the probe from the acquired sample image. The result of subtraction represents the contours of the probes.

In the preferred embodiment of the present invention, any pixel with value of greater than a threshold value is replaced by white color, and any pixel with value of less than the threshold value is replaced by black color.

Additionally, the discontinuities found in the boundaries of the object being manipulated.

Figure 3:
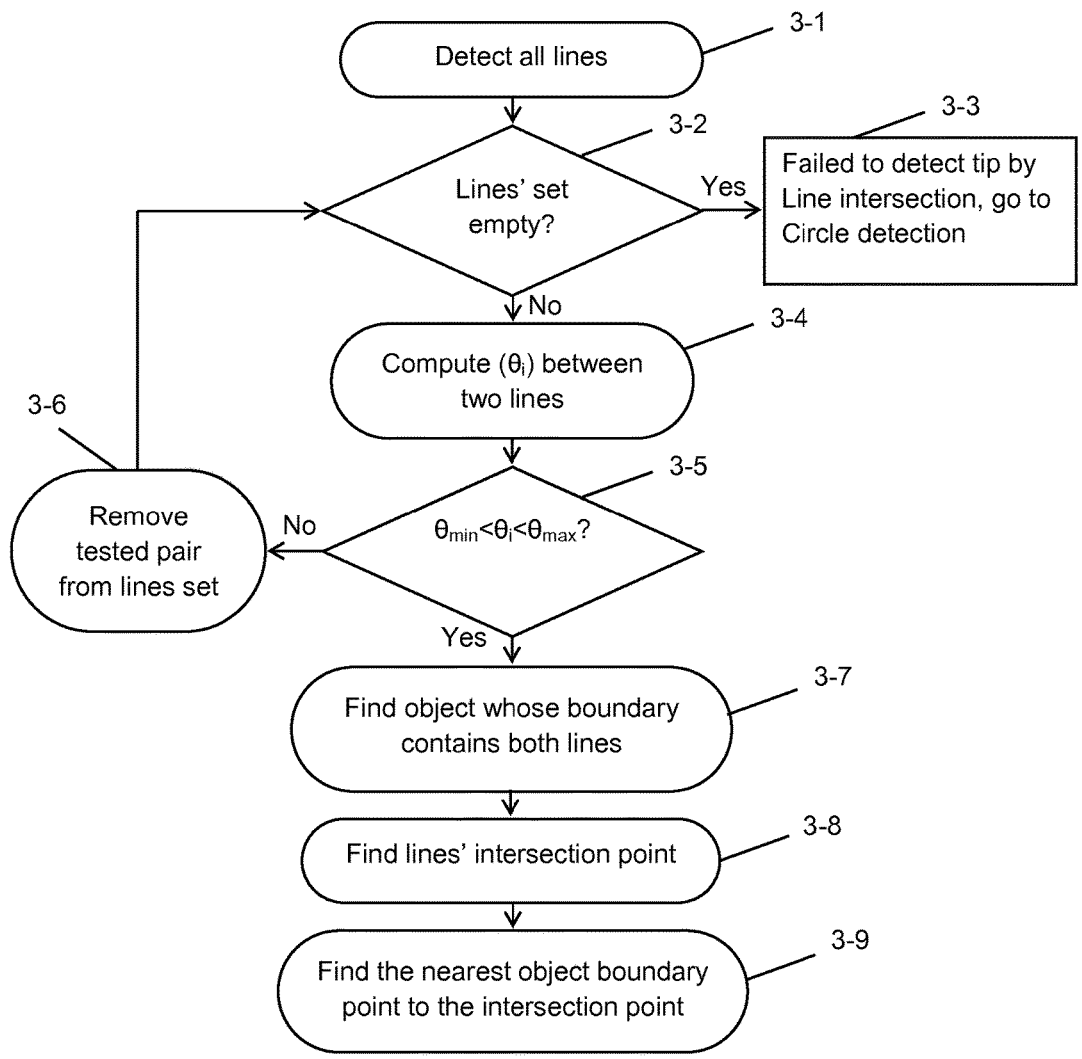
FIG. 3 is a flowchart for probe tip detection using line intersection technique, wherein such technique is used in a system and method for providing real-time visual feedback to control multiple autonomous nano-robots using an SEM configured in accordance with a preferred embodiment of the present invention.

Reference is now made to FIG. 3, which illustrate a flowchart for probe tip detection using line intersection technique, wherein such technique is used in a system and method for providing real-time visual feedback to control multiple autonomous nano-robots using an SEM configured in accordance with a preferred embodiment of the present invention, wherein such line intersection technique comprises the steps of:
  a. Detecting all lines using any state-of-the-art technique, wherein such technique comprises Hough transformation (block 3-1);

b. Determining if lines' set is empty (block 3-2), if yes, the line intersection technique is failed, and the circle detection technique is adopted (block 3-3);
c. Computing the angle ($\theta_i$) between each two different lines if the result of step (b) was negative (block 3-4);
d. Determining if the angle $\theta_i$ lies within a range of pre-determined angles (block 3-5);
e. Removing the tested pair of lines from the lines' set if the result at step (d) is negative (block 3-6) and step (b) is repeated;
f. Finding the object whose boundary contains the pair of lines (block 3-7);
g. Finding the intersection point of the pair of lines (block 3-8); and
h. Finding the nearest object boundary point to the intersection point (block 3-9).

In the preferred embodiment of the present invention, the found boundary point is the probe tip.

Figure 4A:
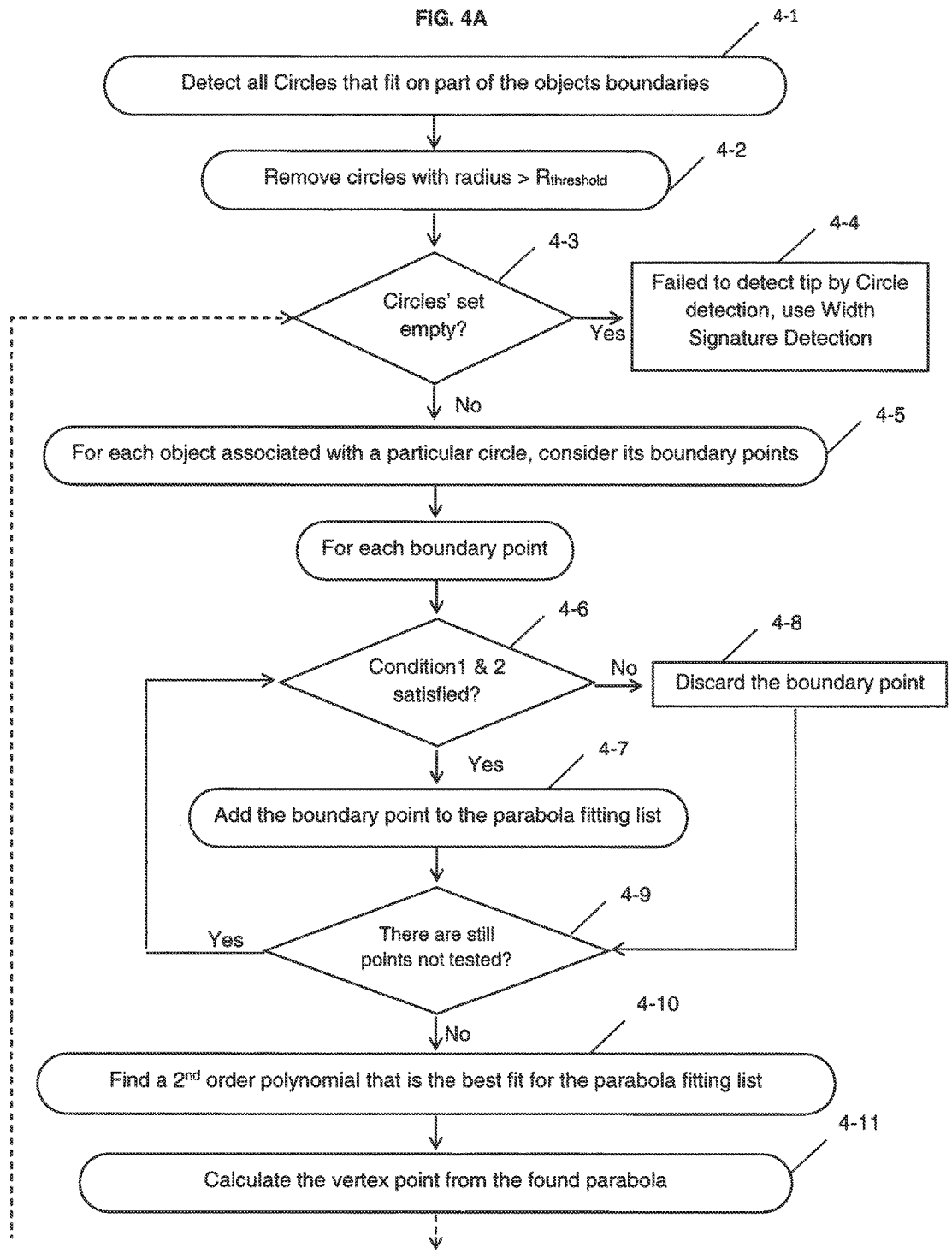
FIGS. 4A-4B illustrate is a flowchart for probe tip detection using circle intersection technique, wherein such technique is used in a system and method for providing real-time visual feedback to control multiple autonomous nano-robots using an SEM configured in accordance with a preferred embodiment of the present invention.
Figure 4B:
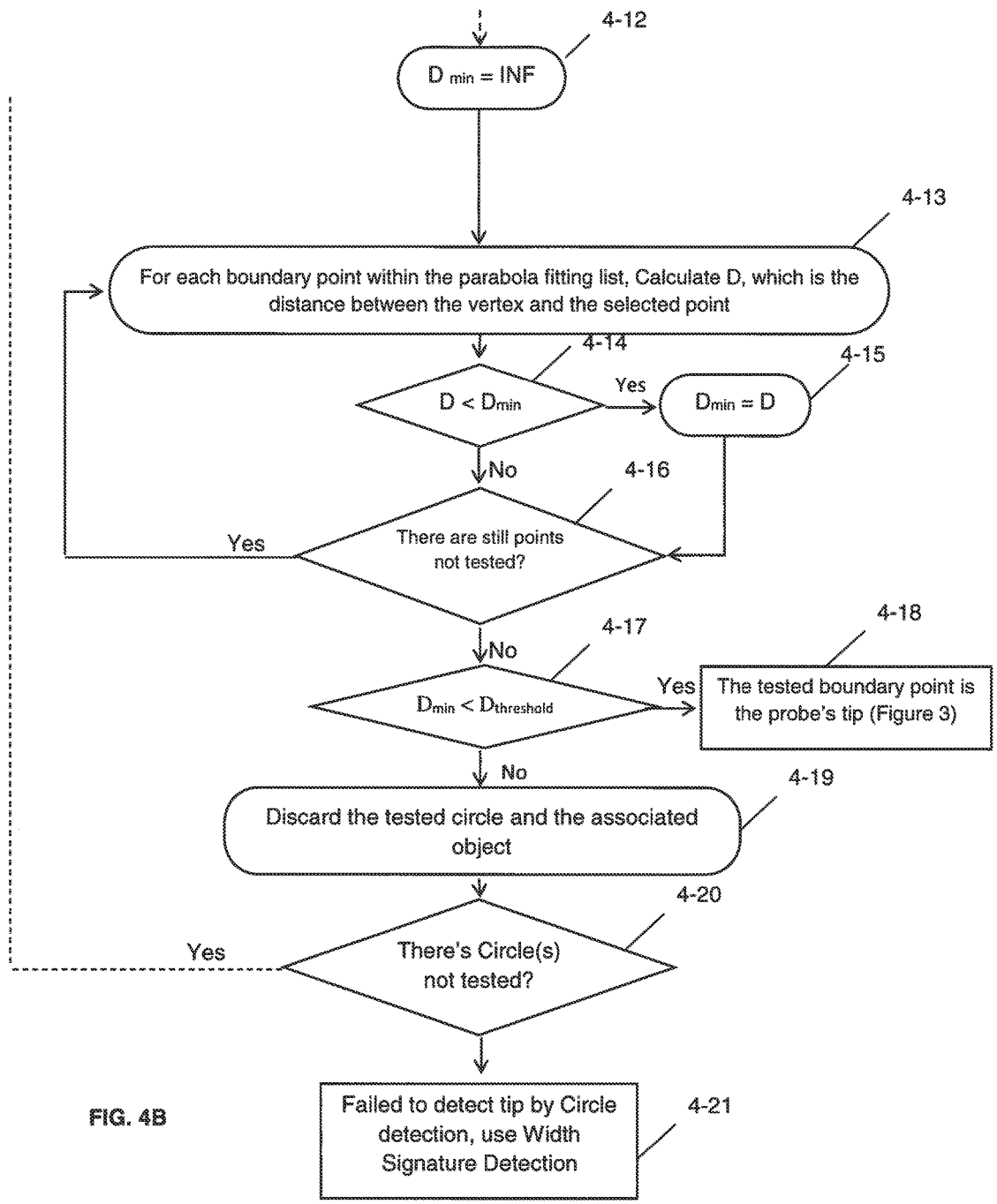

Reference is now being made to FIGS. 4A-4B, which illustrate a circle intersection technique used for probe tip detection, wherein such technique is used in a system and method for providing real-time visual feedback to control multiple autonomous nano-robots using an SEM configured in accordance with a preferred embodiment of the present invention, such technique comprises the steps of:
a. Detecting all circles using state-of-the-art techniques that fit on part of the objects boundaries (block 4-1);
b. Removing the circles having radii greater than a pre-determined threshold value (block 4-2);
c. Determining if the circles' set is empty (block 4-3), if yes, the circle intersection technique is failed, and the width signature detection technique is adopted (block 4-4);
d. Considering the coordinates of boundary points for each object associated with a particular circle (block 4-5);
e. Checking if a first and a second conditions are satisfied for each boundary point (block 4-6);
f. Adding the boundary point for which the said conditions are satisfied to a parabola fitting list, if the result of step (e) is affirmative (block 4-7);
g. Discarding the boundary point if the result of step (e) was negative (block 4-8);
h. Checking if there are still boundary points not tested for the presence of the first and second conditions (block 4-9);
i. Finding a second order polynomial that is of best fit with the parabola fitting list (block 4-10);
j. Calculating the vertex point coordinates from the found parabola (block 4-11);
k. Initializing minimum distance ($D_{min}$)(block 4-12);
l. Identifying the distance (D) between the vertex and the selected point of each boundary point within the parabola fitting list (block 4-13);
m. Checking if the distance (D) is less than the minimum distance ($D_{min}$); and if the result is affirmative, consider the minimum distance ($D_{min}$) as the distance (D) (block 4-15);
n. Checking if there are still points not tested (block 4-16); if the result is affirmative, step (l) is repeated;
o. Checking if the minimum distance is less than the threshold distance ($D_{threshold}$) (block 4-17), if the result is affirmative, then the tested boundary point is the probe's tip (block 4-18);
p. If the result of step (o) is negative, then discard the tested circle and the associated object (block 4-19); and
q. Checking if there is at least one circle not tested (block 4-20); if the result is affirmative, step (c) is repeated, otherwise the circle detection method is failed (block 4-21).

In the circle detection method of the present invention, said first condition implies that the boundary point's X-coordinate must be less than or equal to the X-coordinate of the circle center+radius+threshold, and must be greater than or equal to the X-coordinate of the circle center−radius−threshold.

In the circle detection method of the present invention, said second condition implies that the boundary point's Y-coordinate must be less than or equal to the Y-coordinate of the circle center+radius+threshold, and must be greater than or equal to the Y-coordinate of the circle center−radius−threshold.

In the circle detection method, the parabola vertex point represents the approximated probe head, while the real head point is taken from said parabola fitting list based on minimum distance between such point and the approximated head point.

Figure 5:
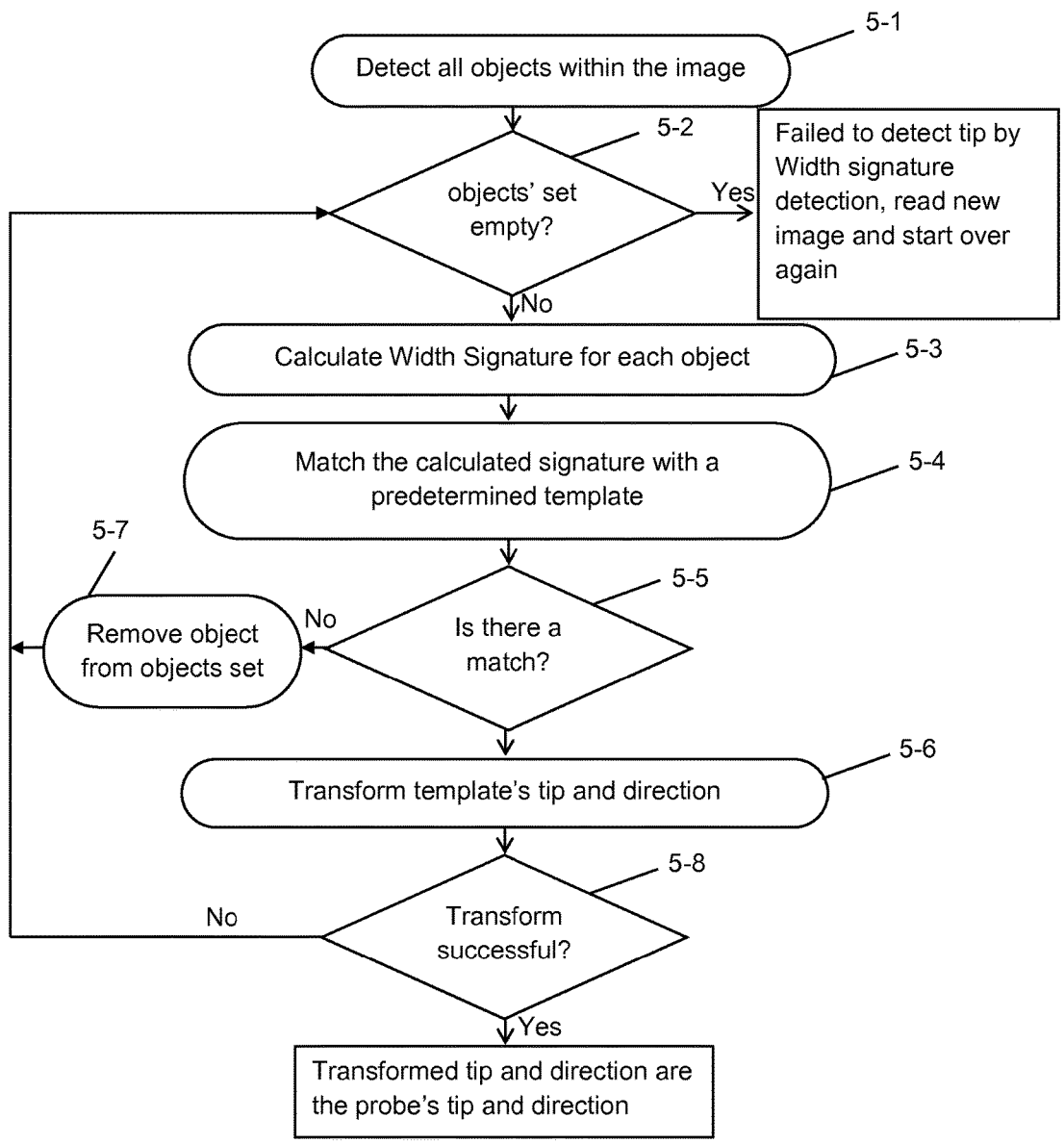
FIG. 5 is a flowchart for probe tip detection using width-signature technique, wherein such technique is used in a system and method for providing real-time visual feedback to control multiple autonomous nano-robots using an SEM configured in accordance with a preferred embodiment of the present invention.

Reference now is being made to FIG. 5, which represents a flowchart for width signature technique used for probe tip detection, wherein such technique is used in a system and method for providing real-time visual feedback to control multiple autonomous nano-robots using an SEM configured in accordance with a preferred embodiment of the present invention, such technique comprises the steps of:
a. Detecting all objects within the image (block 5-1);
b. Determining if the objects' set is empty (block 5-2);
c. Calculating width signature for each object (block 5-3);
d. Matching the calculated object signature with a pre-determined template signature (block 5-4);
e. Determining if there is a match between the calculated object signature and the pre-determined template signature (block 5-5);
f. Transforming template's tip and direction based on the matching information (block 5-6) if the result at step (e) is affirmative, otherwise the object is removed from the objects list (block 5-7) and step (b) is repeated;
g. Determining if the transform succeeded (block 5-8); and
h. Repeating step (b) if the result of step (g) is negative, otherwise the transformed tip and direction will be the probe tip and direction.

Figure 6:
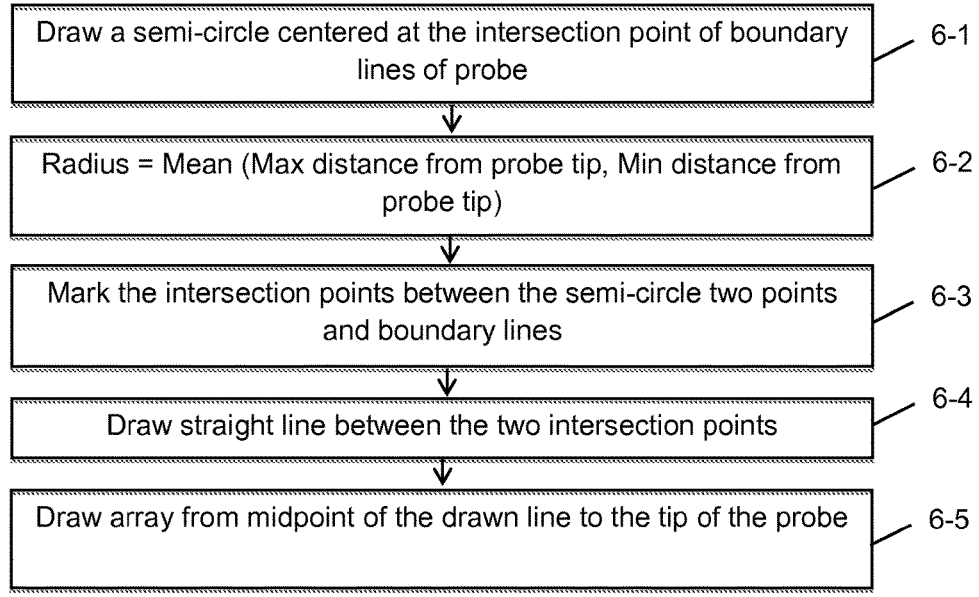
FIG. 6 is a flowchart for the detection of probe tip direction using a system and method for providing real-time visual feedback to control multiple autonomous nano-robots using an SEM configured in accordance with a preferred embodiment of the present invention.
Figure 7:
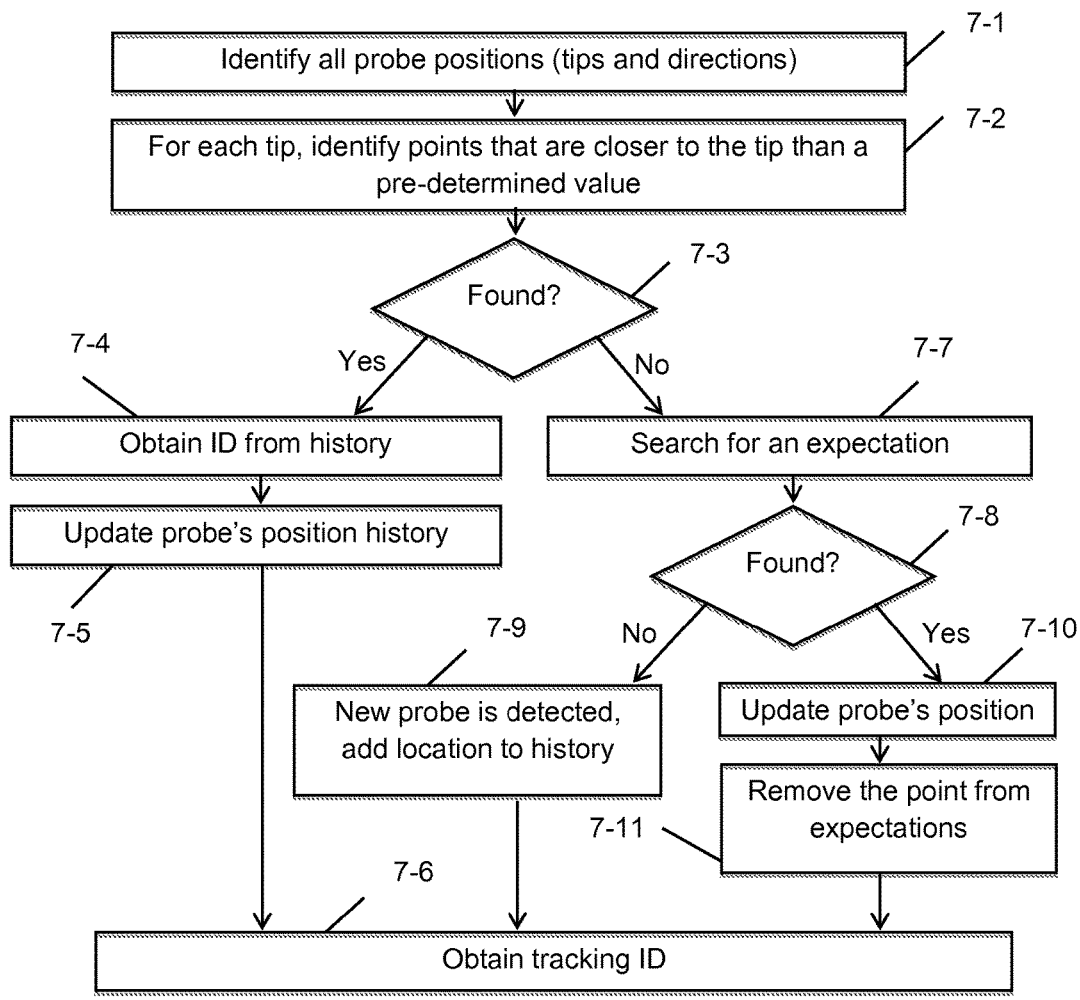
FIG. 7 is a flowchart for distinguishing between each probe using a system and method for providing real-time visual feedback to control multiple autonomous nano-robots using an SEM configured in accordance with a preferred embodiment of the present invention.

Reference is now being made to FIG. 6, which represents a flowchart for the technique used for the detection of probe tip direction using a system and method for providing real-time visual feedback to control multiple autonomous nano-robots using an SEM, configured in accordance with a preferred embodiment of the present invention, wherein such technique comprises the steps of:
a. Drawing a virtual semi-circle with a center at an intersection point between two boundary lines of the probe (block 6-1), wherein the radius of such semi-circle is the mean of the maximum distance from the probe tip and the minimum distance from the probe tip (block 6-2);
b. Marking the intersection points of said virtual semi-circle with the said boundary lines (block 6-3);
c. Drawing a straight line between the said two intersection points (block 6-4); and
d. Drawing an array from the midpoint of the line drawn in step (c) to the tip of the probe (block 6-5).

Said array vector drawn in step (d) above represents the direction of the probe.

In the preferred embodiment of the present invention, there is provided multiple nano-robots. This implies that distinguishing between each probe and tracking such probe is required. The reference is now being made to FIG. 7, which illustrates a flowchart for the steps used in distinguishing between each probe by said tracking sub-unit 221, wherein such steps comprise:

a. Identifying all probe positions (tips and direction) (block 7-1);
b. Identifying points that are closer to the tip than a pre-determined value (block 7-2);
c. Checking if there are identified points in step (b) (block 7-3);
d. Getting probes' identification from a position history list if the result of step (c) is affirmative (block 7-4), and updating the probe position history (block 7-5);
e. Searching for an expectation if the result of step (c) is negative (block 7-7);
f. Checking if the expectation of step (e) is found (block 7-8);
g. Updating the position of the probe if the result at step (f) is affirmative (block 7-10) and removing the position from the expectation list (block 7-11);
h. Adding the identified probe position to the position history list if the result of step (f) is negative (block 7-9); and
i. Obtaining the tracking identification (block 7-6).

Figure 8:
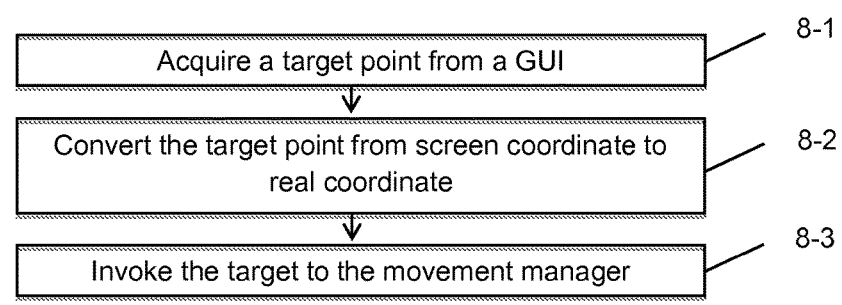
FIG. 8 is a flowchart for the operation of a decision sub-unit used in a system and method for providing real-time visual feedback to control multiple autonomous nano-robots using an SEM configured in accordance with a preferred embodiment of the present invention.

Reference is now being made to FIG. 8, which represents a flowchart for the operation of the decision sub-unit 222 used in a system and method for providing real-time visual feedback to control multiple autonomous nano-robots using an SEM configured in accordance with a preferred embodiment of the present invention, wherein the operation of said decision sub-unit 222 comprises the steps of:

a. Acquiring a target point from a Graphical User Interface (block 8-1);
b. Converting the target point from screen coordinate into a real coordinate (block 8-2); and
c. Invoking the target point to a movement manager (block 8-3).

Figure 9:
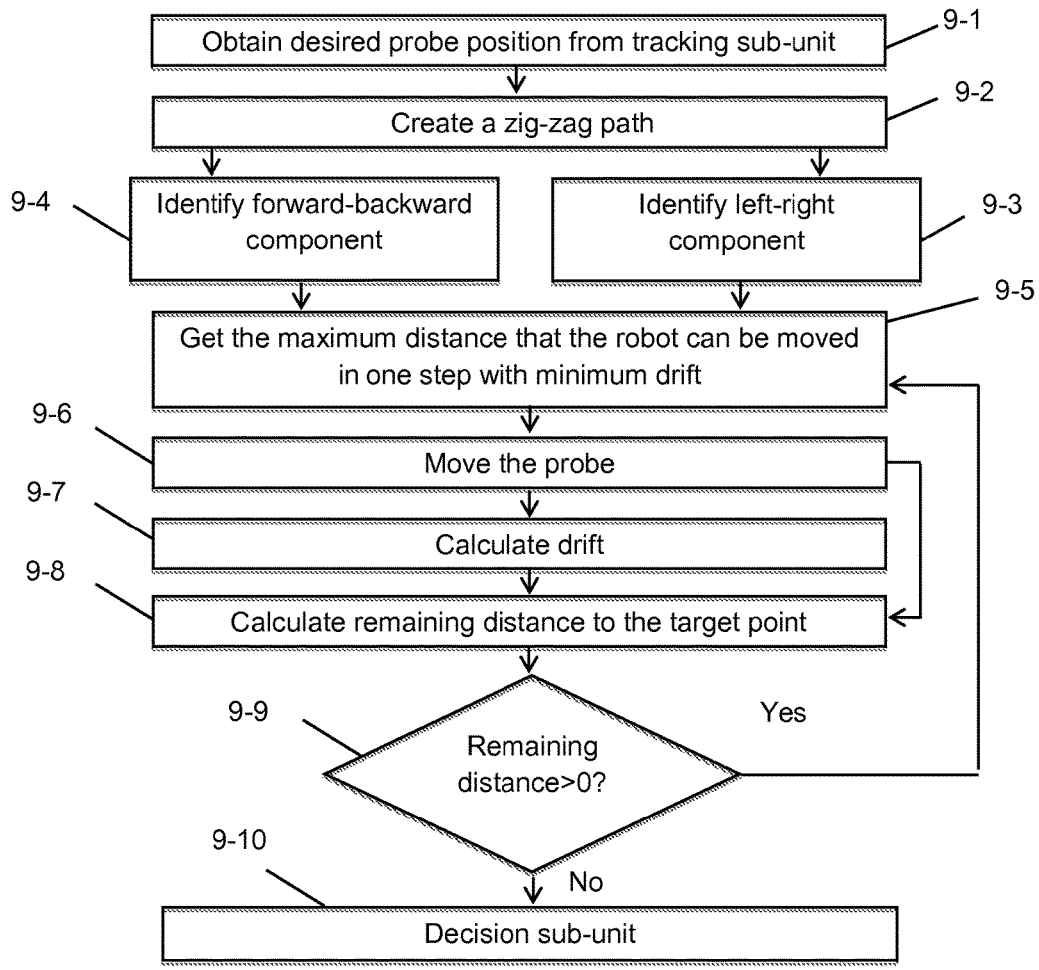
FIG. 9 is a flowchart for the operation of a movement manager sub-unit used in a system and method for providing real-time visual feedback to control multiple autonomous nano-robots using an SEM configured in accordance with a preferred embodiment of the present invention.

Reference is now being made to FIG. 9, which illustrates a flowchart for the operation of the movement manager sub-unit 223, wherein such operation includes the following steps:

a. Obtaining a desired probe position from the tip tracking unit (block 9-1);
b. Creating a zigzag path to the desired destination (block 9-2);
c. Identifying a left-right component and a forward-backward component of the zigzag path (blocks 9-3 and 9-4);
d. Getting the maximum distance that the robot can be moved in one step with minimum drift (block 9-5);
e. Moving the probe (block 9-6);
f. Calculating the drift value (block 9-7);
g. Calculating the remaining distance to the target point (block 9-8); and
h. If the remaining distance is greater than zero, Steps d-g are repeated (block 9-9), otherwise a signal is sent to said decision sub-unit (block 9-10).

Figure 10:
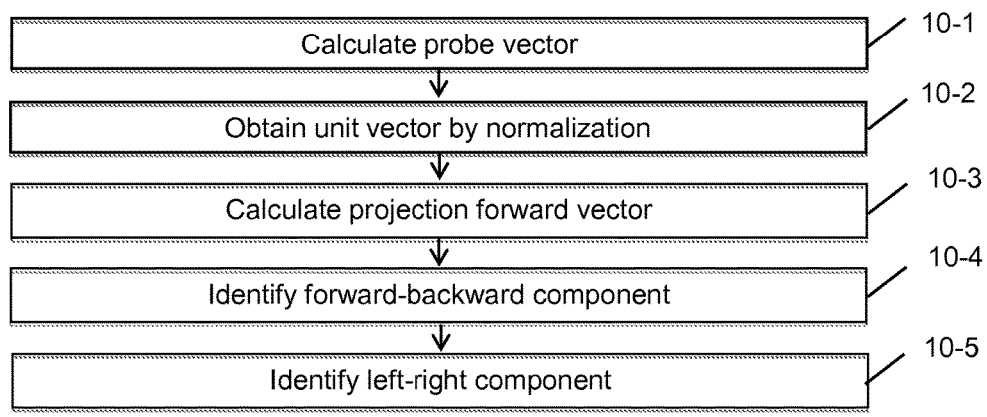
FIG. 10 is a flowchart for creating a zigzag path by a movement manager sub-unit of a system and method for providing real-time visual feedback to control multiple autonomous nano-robots using an SEM configured in accordance with a preferred embodiment of the present invention.

Reference is now being made to FIG. 10, which illustrates the flowchart of the steps of creating the zigzag path of the probe, wherein such zigzag path is obtained by said movement manager sub-unit 223, said steps comprise:

a. Calculating the probe vector (block 10-1);
b. Normalizing the probe vector to obtain a unit vector (block 10-2);
c. Calculating projection forward vector by manipulating the dot product of the results obtained in steps (a) and (b) (block 10-3);
d. Identifying the forward-backward component by computing the dot product of the results obtained in steps (b) and (c) (block 10-4); and
e. Identifying the left-right component by subtracting the forward-backward component obtained at step (d) from the unit vector obtained from step (b) (block 10-5).

Figure 11:
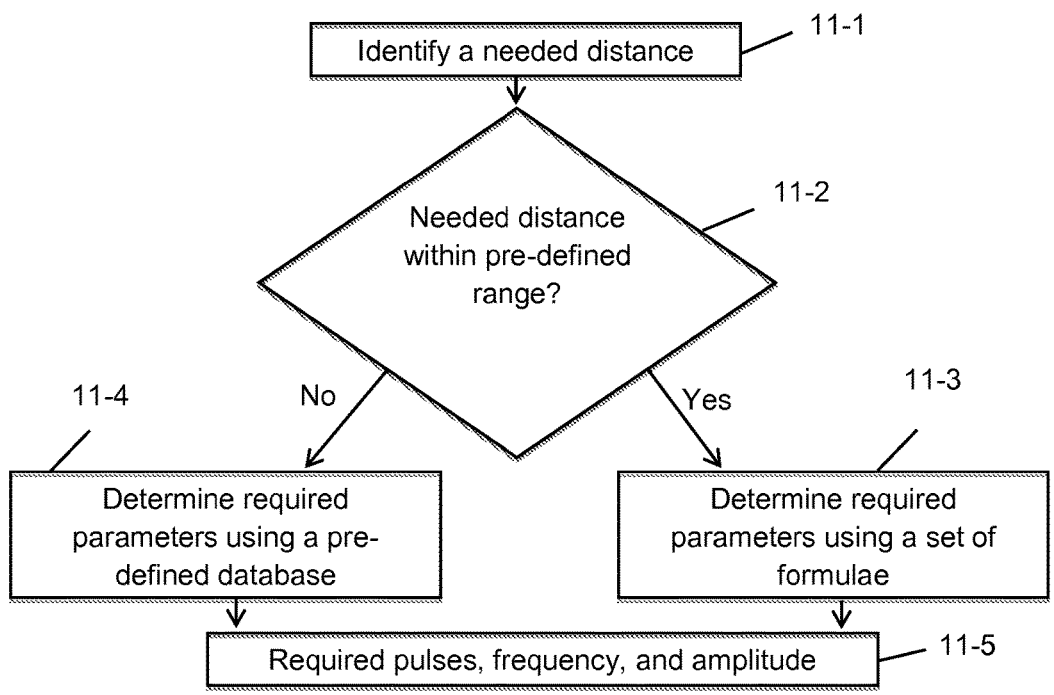
FIG. 11 is a flowchart for getting a maximum distance by a movement manager sub-unit of a system and method for providing real-time visual feedback to control multiple autonomous nano-robots using an SEM configured in accordance with a preferred embodiment of the present invention.

Reference is now being made to FIG. 11, which illustrates a flowchart for the steps of determining the required parameters of a signal needed to move the robot probe by said movement manager sub-unit 223, such steps comprise:

a. Identifying a needed distance (block 11-1);
b. Identifying if the needed distance lies within a pre-defined range (block 11-2);
c. Applying a set of formulae (block 11-3) to determine the required parameters (block 11-5) If the result of step (b) is affirmative; and
d. Using a pre-defined database (block 11-4) to determine the required parameters (block 11-5) if the result of step (b) is negative.

In the preferred embodiment of the present invention, said required parameters comprise amplitude, frequency and pulse. The amplitude controls the step size of the probe, the frequency controls the speed, and the pulse controls the distance.

Said set of formulae comprises a formula for the left-right movement of the probe, and a formula for the forward-backward movement of the probe.

Figure 12:
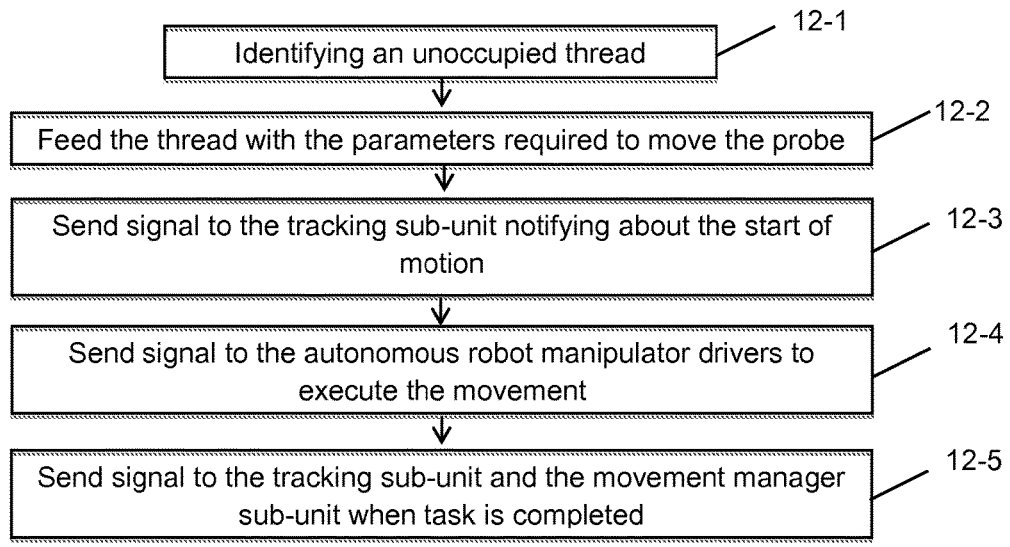
FIG. 12 is a flowchart for moving a manipulator's probe by a movement manager sub-unit of a system and method for providing real-time visual feedback to control multiple autonomous nano-robots using an SEM configured in accordance with a preferred embodiment of the present invention.

Reference is now being made to FIG. 12, which illustrates a flowchart for the steps of moving a manipulator's probe by said movement manager sub-unit, wherein such steps comprise:

a. Identifying an unoccupied thread (block 12-1);
b. Feeding said unoccupied thread with said required parameters to move the probe (block 12-2);
c. Sending a signal to said tracker sub-unit to notify about the start of the movement (block 12-3);
d. Sending a signal to said autonomous robot manipulators drivers to execute the movement (block 12-4); and
e. Sending a signal, from said autonomous robot manipulators drivers, to said tracking sub-unit and said movement manager sub-unit when a task is accomplished (block 12-5).

Figure 13:
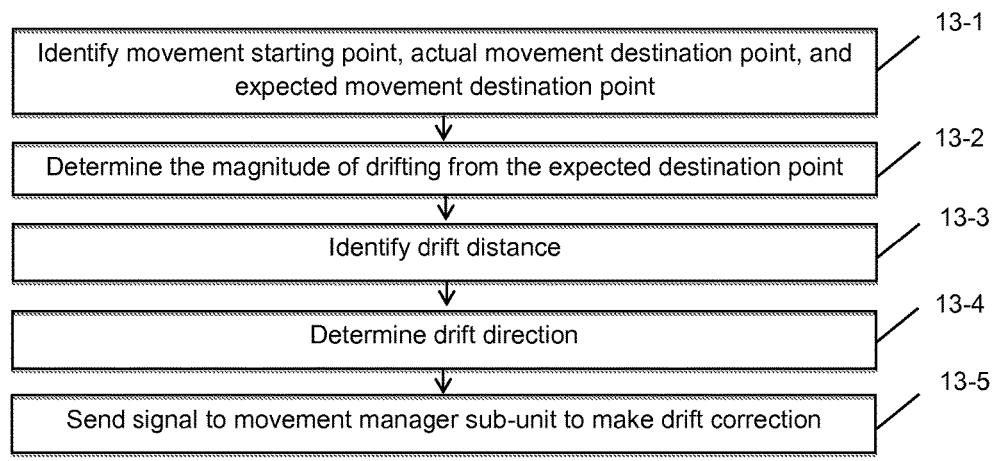
FIG. 13 is a flowchart for calculating a drift of a manipulator by a movement manager sub-unit of a system and method for providing real-time visual feedback to control multiple autonomous nano-robots using an SEM configured in accordance with a preferred embodiment of the present invention.
Figure 14:
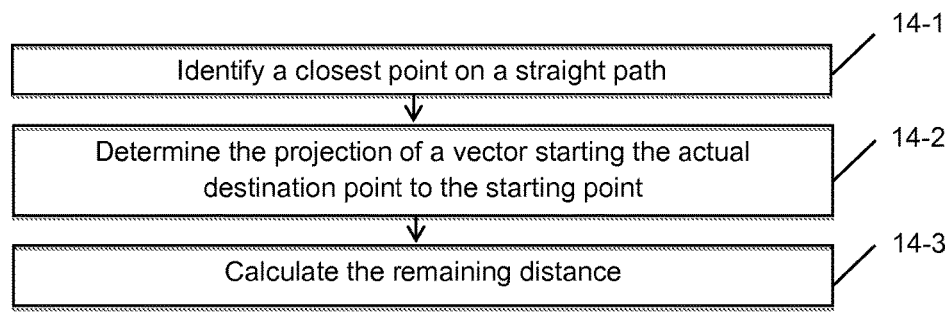
FIG. 14 is a flowchart for calculating the remaining distance of a manipulator by a movement manager sub-unit of a system and method for providing real-time visual feedback to control multiple autonomous nano-robots using an SEM configured in accordance with a preferred embodiment of the present invention.

Reference is now being made to FIG. 13, which illustrates a flowchart for the steps of calculating drift by said controller unit 23 that occurs during the movement of the manipulator's probe, wherein such steps comprise:

a. Identifying a movement starting point, an actual movement destination point, and an expected movement destination point (block 13-1);
b. Determining the magnitude of the drifting from the expected path as straight line between the movement starting point and the expected movement destination point according (block 13-2);
c. Identifying the drift distance, wherein such distance is the minimum distance between the actual movement destination point to the straight path between the starting movement point to the expected movement destination point (block 13-3);
d. Determining the direction of the drift (block 13-4):

Reference is now being made to FIG. 14, which illustrates a flowchart for the steps of calculating the remaining distance after the drift to reach the expected destination point, wherein such steps are implemented by said controller unit 23, and wherein such steps comprise:

a. Identifying a closest point on the straight path between the starting point and the expected destination point (block 14-1);
b. Determining the projection of vector starting from the actual destination point to the starting point (block 14-2); and
c. Calculating the remaining distance by subtracting the magnitude of the projection of step (b) from the total distance of the straight path between the starting and the expected destination point (block 14-3).

In the preferred embodiment of the present invention, the parameters needed to adjust the drift caused by the movement of the probe are the same parameters disclosed in FIG. 11, and are calculated in the same way.

Figure 15:
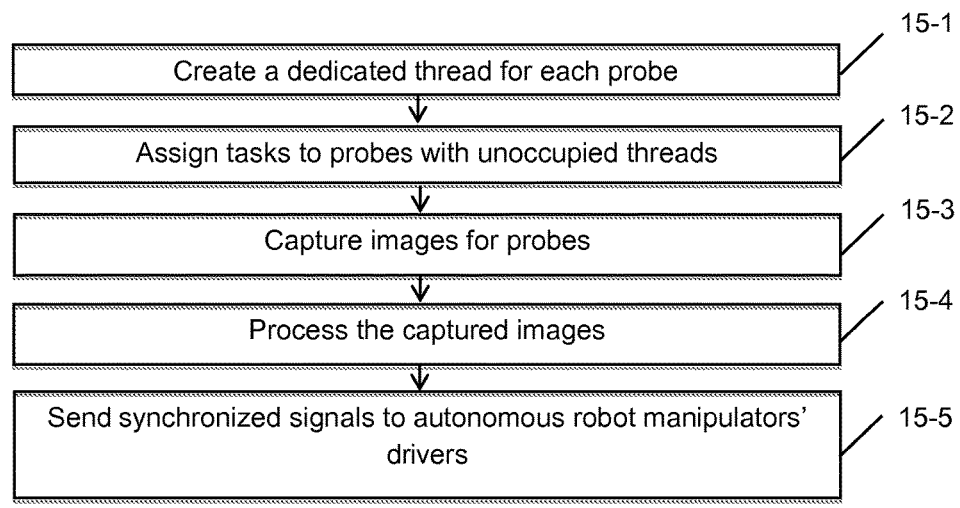
FIG. 15 is a flowchart for controlling multiple autonomous robots by a controller unit of a system and method for providing real-time visual feedback to control multiple autonomous nano-robots using an SEM configured in accordance with a preferred embodiment of the present invention.

Reference is now being made to FIG. 15, which illustrates a flowchart for the steps adopted for controlling multiple robots, by a controller unit 23, wherein such steps comprise:
a. Creating a dedicated thread for each probe (block 15-1);
b. Assigning tasks to probes within unoccupied threads (block 15-2);
c. Capturing images for the probes using the SEM (block 15-3);
d. Processing the captured images by said image processing unit (block 15-4); and
e. Sending synchronized signals to said autonomous robot manipulators drivers (block 15-5).

Figure 16:
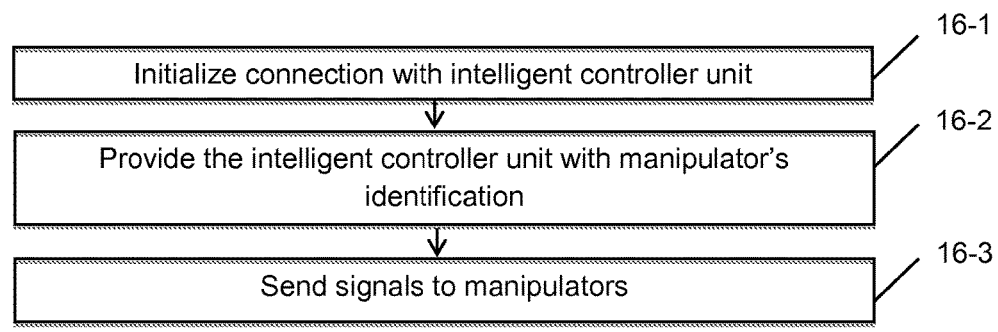
FIG. 16 is a flowchart for the operation of autonomous robot manipulators drivers of a system and method for providing real-time visual feedback to control multiple autonomous nano-robots using an SEM configured in accordance with a preferred embodiment of the present invention.

Reference is now being made to FIG. 16, which illustrates a series of steps for the operation of said autonomous robot manipulators drivers, wherein such steps comprise:
a. Initializing a connection with said controller unit (block 16-1);
b. Providing said controller unit with manipulator's identification (block 16-2);
c. Sending signals to said manipulators (block 16-3).

In the preferred embodiment of the present invention, said signals sent to said manipulators comprise pulses, amplitude and frequency.

Figure 17:
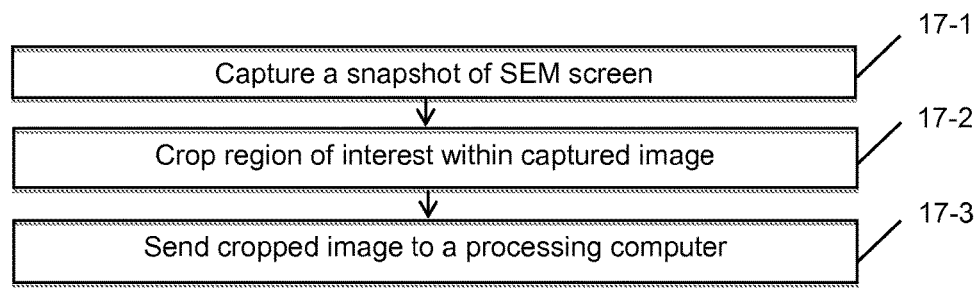
FIG. 17 is a flowchart for the operation of the feedback of an SEM with imaging system of a system and method for providing real-time visual feedback to control multiple autonomous nano-robots using an SEM configured in accordance with a preferred embodiment of the present invention.

Reference is now being made to FIG. 17, which illustrates the steps used in obtaining visual feedback in said SEM, wherein such steps comprises the steps of:
a. Capturing a snap shot image from the SEM screen (block 17-1);
b. Cropping a region of interest within the captured image (block 17-2); and
c. Sending the cropped image through a network to a processing computer (block 17-3).

While the present invention has been described in details and with reference to specific embodiments thereof, it will be apparent to one skilled in the art that various additions, omissions and modifications can be made without departing from the spirit and scope thereof.

Although the above description contains many specificities, these should not be construed as limitations on the scope of the invention but is merely representative of the presently preferred embodiments of this invention. The embodiment(s) of the invention described above is(are) intended to be exemplary only. The scope of the invention is therefore intended to be limited solely by the scope of the appended claims.

What is claimed is:

1. A method of providing real-time visual feedback to control multiple autonomous nano-robots using an SEM, comprising the steps of:
a. Acquiring, by an image acquisition unit, an image sample;
b. Processing, by an image processing unit, the acquired image sample;
c. Detecting, by a detection sub-unit, a tip of a manipulator probe by a line intersection technique;
d. Determining if said tip of said manipulator is detected;
e. Comparing said detected tip of step (c) with a pre-determined expected tip if the result at step (d) is affirmative;
f. Determining if the result at step (e) is affirmative, if yes, the result will be sent to said controller unit (step (o));
g. Detecting, by said detection sub-unit, said tip of the manipulator probe by a circle detection technique;
h. Determining if said tip of said manipulator is detected;
i. Comparing said detected tip of step (g) with a pre-determined expected tip if the result at step (h) is affirmative;
j. Determining if the result at step (i) is affirmative, if yes, said result will be sent to a controller unit (step (o));
k. Detecting, by said detection sub-unit, said tip of said manipulator probe by a width signature detection technique;
l. Determining if said tip of said manipulator is detected;
m. Comparing said detected tip of step (l) with a pre-determined expected tip if the result at step (l) is affirmative;
n. Determining if the result at step (m) is affirmative, if yes, the result will be sent to said controller unit (step (o)), otherwise the process is repeated again; and
o. Sending, by the controller unit, instructions to autonomous robot manipulators' drivers to move said probe of said robot manipulator accordingly.

2. The method of claim 1, further comprising detecting the direction of said probe tip.

3. The method of claim 1, wherein said lines are detected using state-of-the-art line detection techniques.

4. The method of claim 1, wherein said boundary is said probe tip.

5. The method of claim 1, wherein said line intersection technique comprises the steps of:
a. Detecting all lines in said acquired image;
b. Determining if a lines' set is empty, if yes, such line intersection technique is failed, and said circle detection technique should be adopted;
c. Computing the angle ($\theta_i$) between each two different lines if the result of step (b) is negative;
d. Determining if the angle $\theta_i$ lies within a range of pre-determined angles;
e. Removing the tested pair of lines from said lines' set if the result at step (d) is negative, and step (b) is repeated;
f. Finding an object whose boundary contains said pair of lines;
g. Finding an intersection point of said pair of lines; and
h. Finding the nearest object boundary point to the intersection point.

6. The method of claim 1, wherein said circle intersection technique comprises the steps of:
a. Detecting all circles that fit on part of the objects boundaries;
b. Removing the circles having radii greater than a pre-determined threshold value;
c. Determining if the circles' set is empty, if yes, the circle intersection technique is failed, and the width signature detection technique is adopted;
d. Considering the coordinates of boundary points for each object associated with a particular circle;
e. Checking if a first and a second conditions are satisfied for each boundary point;

f. Adding the boundary point for which the said conditions are satisfied to a parabola fitting list, if the result of step (e) is affirmative;
g. Discarding the boundary point if the result of step (e) is negative;
h. Checking if there are still boundary points not tested for the presence of the first and second conditions;
i. Finding a second order polynomial that is of best fit with the parabola fitting list;
j. Calculating the vertex point coordinates from the found parabola;
k. Determining a minimum distance ($D_{min}$);
l. Identifying the distance (D) between the vertex and the selected point of each boundary point within the parabola fitting list (block 4-13);
m. Checking if the distance (D) is less than the minimum distance ($D_{min}$); and if the result is affirmative, consider the minimum distance ($D_{min}$) as the distance (D);
n. Checking if there are still points not tested; if the result is affirmative, step (l) is repeated;
o. Checking if the minimum distance is less than the threshold distance ($D_{threshold}$), if the result is affirmative, then the tested boundary point is the probe's tip;
p. If the result of step (o) is negative, then discard the tested circle and the associated object; and
q. Checking if there is at least one circle not tested; if the result is affirmative, step (c) is repeated, otherwise the circle detection method is failed.

7. The method of claim 6, wherein said first condition implies that the boundary point's X-coordinate must be less than or equal to the X-coordinate of the circle center+radius+threshold, and must be greater than or equal to the X-coordinate of the circle center−radius−threshold.

8. The method of claim 6, wherein said second condition implies that the boundary point's Y-coordinate must be less than or equal to the Y-coordinate of the circle center+radius+threshold, and must be greater than or equal to the Y-coordinate of the circle center−radius−threshold.

9. The method of claim 6, the parabola vertex point represents the approximated probe head, while the real head point is taken from said parabola fitting list based on minimum distance between such point and the approximated head point.

10. The method of claim 1, wherein said width signature technique used for probe tip detection, wherein such technique is used in a system and method for providing real-time visual feedback to control multiple autonomous nano-robots using an SEM configured in accordance with a preferred embodiment of the present invention, such technique comprises the steps of:
    a. Detecting all objects within said captured image;
    b. Determining if an objects' set is empty;
    c. Calculating width signature for each object;
    d. Matching the calculated object signature with a pre-determined template signature;
    e. Determining if there is a match between the calculated object signature and the pre-determined template signature;
    f. Transforming template's tip and direction based on the matching information if the result at step (e) is affirmative, otherwise step (b) is repeated;
    g. Determining if the transform succeeded; and
    h. Repeating step (b) if the result of step (g) is negative, otherwise the transformed tip and direction will be the probe tip and direction.

11. The method of claim 1, wherein the movement of said probe is in a zigzag pattern.

12. The method of claim 11, wherein drift is corrected in the movement of said probe.

13. A system configured to control multiple autonomous nano-robots, comprising:
    a. an image acquisition unit configured to acquire an image sample;
    b. an image processing unit configured to process the acquired image sample;
    c. a detection sub-unit configured to detect a tip of a manipulator probe by a line intersection technique;
    d. circuitry configured to determine if said tip of said manipulator probe is detected by said line intersection technique;
    e. circuitry configured to compare said detected tip of said manipulator probe with a pre-determined expected tip if it is determined that said tip of said manipulator is detected by said line intersection technique;
    f. circuitry configured to send a first result to a controller unit that said detected tip of said manipulator probe was affirmatively compared with said pre-determined expected tip;
    g. said detection sub-unit configured to detect said tip of the manipulator probe by a circle detection technique;
    h. circuitry configured to determine if said tip of said manipulator probe is detected by said circle detection technique;
    i. circuitry configured to compare said detected tip of said manipulator probe with said pre-determined expected tip if it is determined that said tip of said manipulator probe is detected by said circle detection technique;
    j. circuitry configured to send a second result to said controller unit that said detected tip of said manipulator probe was affirmatively compared with said pre-determined expected tip;
    k. said detection sub-unit configured to detect said tip of the manipulator probe by a width signature detection technique;
    l. circuitry configured to determine if said tip of said manipulator probe is detected by said width signature detection technique;
    m. circuitry configured to compare said detected tip of said manipulator probe with said pre-determined expected tip if it is determined that said tip of said manipulator probe is detected by said width signature detection technique;
    n. circuitry configured to send a third result to said controller unit that said detected tip of said manipulator probe was affirmatively compared with said pre-determined expected tip; and
    o. said controller unit configured to send instructions to drivers of autonomous robot manipulators to move said manipulator probe accordingly.

\* \* \* \* \*